(12) United States Patent
Yunker et al.

(10) Patent No.: US 8,872,660 B2
(45) Date of Patent: Oct. 28, 2014

(54) POWERED ITEM ATTACHMENT DEVICE

(75) Inventors: Geoff Yunker, Vero Beach, FL (US); Walter V. Raczynski V, Arlington Heights, IL (US); Charles L. Zimnicki, Lake Zurich, IL (US)

(73) Assignees: Walter V. Raczynski, Milwaukee, WI (US); Charles L. Zimnicki, Milwaukee, WI (US)

( * ) Notice: Subject to any disclaimer, the term of this patent is extended or adjusted under 35 U.S.C. 154(b) by 95 days.

(21) Appl. No.: 13/584,229

(22) Filed: Aug. 13, 2012

(65) Prior Publication Data

US 2013/0063267 A1 Mar. 14, 2013

Related U.S. Application Data

(60) Provisional application No. 61/523,297, filed on Aug. 13, 2011.

(51) Int. Cl.
*G08B 13/14* (2006.01)
*H03K 17/96* (2006.01)

(52) U.S. Cl.
CPC .. *H03K 17/962* (2013.01); *H03K 2217/960755* (2013.01)
USPC ............ 340/571; 340/568.1; 340/568.8; 248/187.1; 248/551

(58) Field of Classification Search
CPC ............ G08B 13/1427; G08B 13/128; G08B 13/2434; G08B 13/1445; G08B 13/1463; G08B 25/008; G08F 1/1626; A47F 7/024; E05B 73/0017; E05B 45/005
USPC .......... 340/571, 572.9, 239.11, 568.1–568.4, 340/568.8, 539.11; 248/187.1, 310, 551
See application file for complete search history.

(56) References Cited

U.S. PATENT DOCUMENTS

| | | | | |
|---|---|---|---|---|
| 4,015,253 | A * | 3/1977 | Goldstein | 341/9 |
| 5,886,633 | A * | 3/1999 | Adams | 712/227 |
| 7,327,276 | B1 * | 2/2008 | Deconinck et al. | 340/687 |
| 7,522,047 | B2 | 4/2009 | Belden, Jr. et al. | |
| 7,593,142 | B2 * | 9/2009 | Marszalek et al. | 358/474 |
| 7,626,500 | B2 * | 12/2009 | Belden et al. | 340/568.1 |
| 7,710,266 | B2 * | 5/2010 | Belden et al. | 340/568.3 |
| 8,368,536 | B2 * | 2/2013 | Fawcett et al. | 340/568.1 |
| 8,558,414 | B2 * | 10/2013 | Warren et al. | 307/154 |
| 8,558,688 | B2 * | 10/2013 | Henson et al. | 340/539.1 |
| 8,564,438 | B2 * | 10/2013 | Fawcett et al. | 340/568.8 |
| 2006/0097875 | A1 * | 5/2006 | Ott | 340/572.1 |
| 2007/0171061 | A1 * | 7/2007 | Belden et al. | 340/568.2 |
| 2008/0169923 | A1 * | 7/2008 | Belden et al. | 340/568.3 |
| 2009/0033492 | A1 * | 2/2009 | Rapp et al. | 340/568.8 |
| 2009/0058643 | A1 * | 3/2009 | Groth | 340/568.1 |
| 2010/0238031 | A1 * | 9/2010 | Belden et al. | 340/568.1 |
| 2010/0301998 | A1 * | 12/2010 | Marszalek et al. | 340/5.65 |
| 2010/0315239 | A1 * | 12/2010 | Yang | 340/572.9 |
| 2011/0102179 | A1 * | 5/2011 | Ezzo et al. | 340/568.1 |
| 2011/0288938 | A1 * | 11/2011 | Cook et al. | 705/14.66 |
| 2012/0019383 | A1 * | 1/2012 | Fawcett et al. | 340/568.1 |
| 2012/0280810 | A1 * | 11/2012 | Wheeler | 340/539.11 |

* cited by examiner

*Primary Examiner* — Hoi Lau
(74) *Attorney, Agent, or Firm* — Brian G. Gilpin; Godfrey & Kahn, S.C.

(57) ABSTRACT

A powered item attachment device includes an onboard power supply and alarm system that sounds in the event a protected device is tampered with or removed from a retail display. The powered item attachment device may also track the location of a protected device if it is removed from the display device.

7 Claims, 5 Drawing Sheets

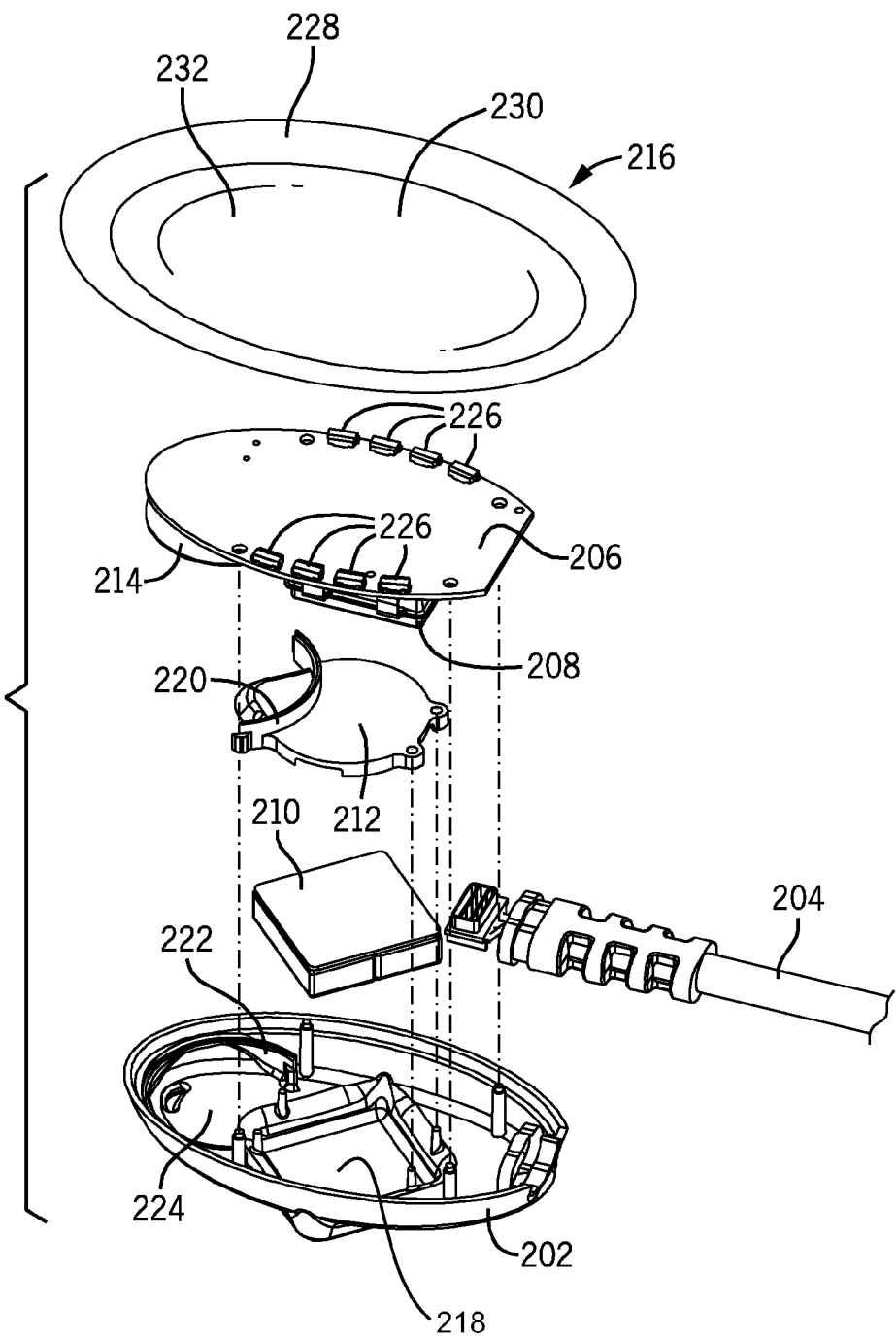

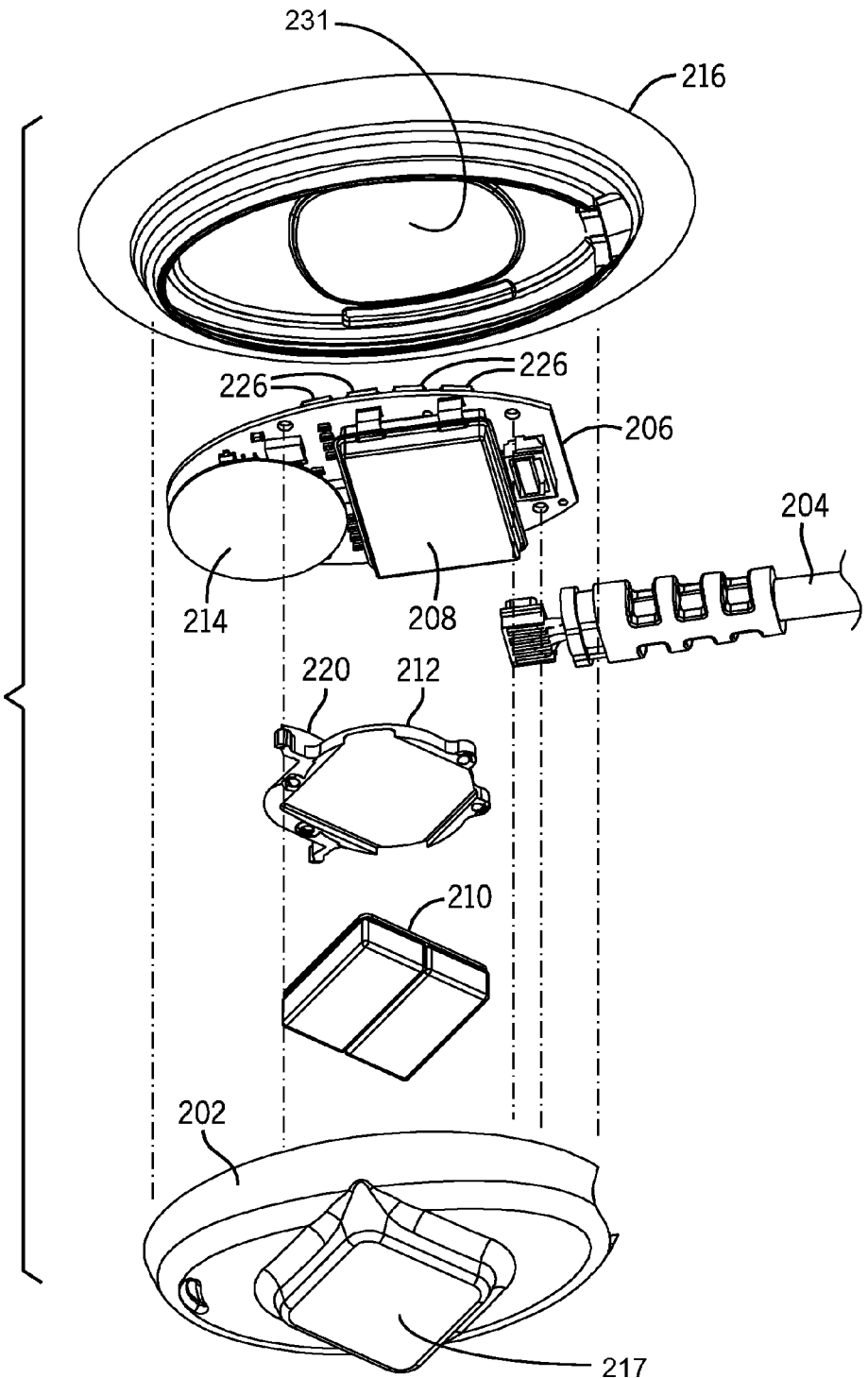

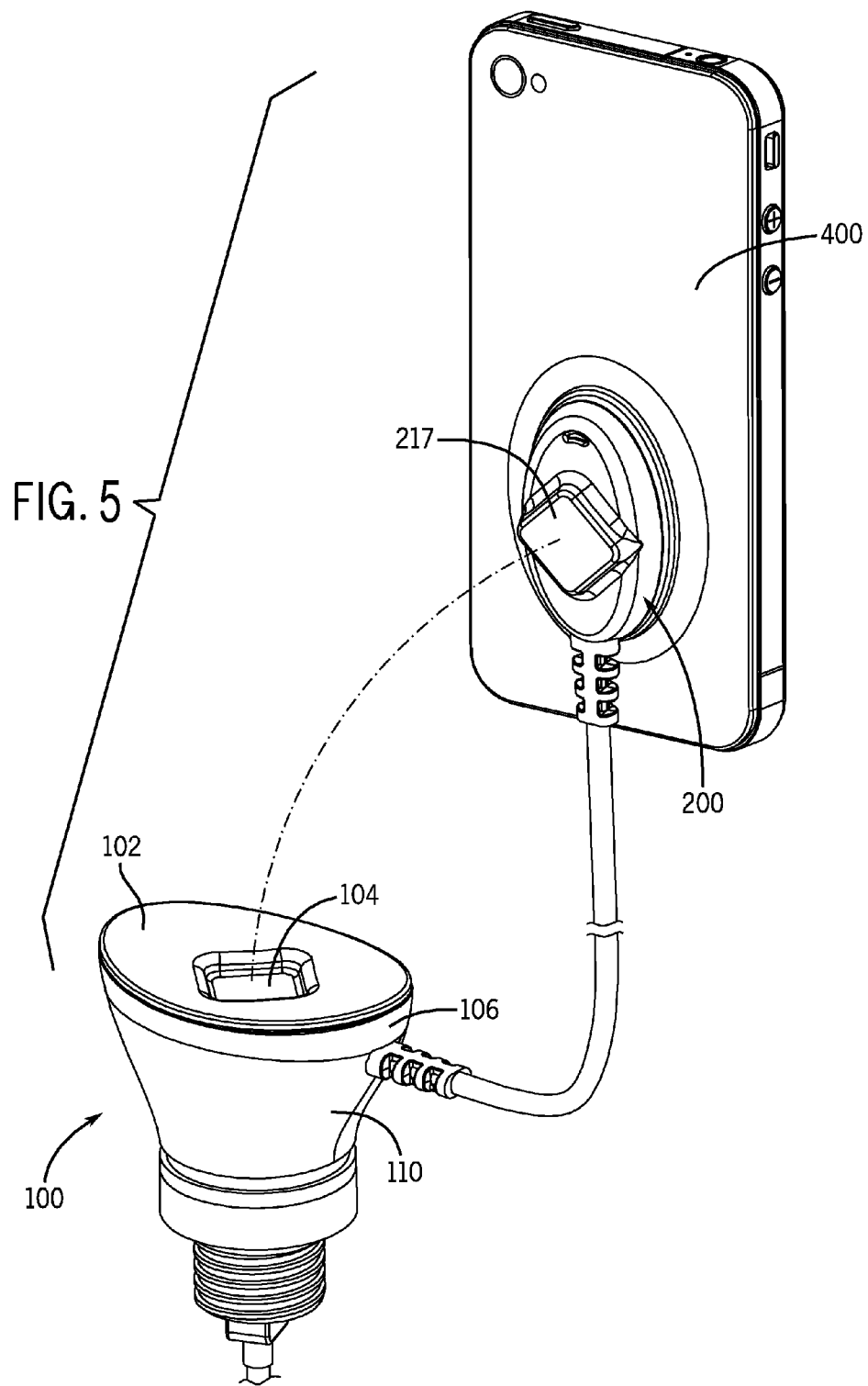

US 8,872,660 B2

POWERED ITEM ATTACHMENT DEVICE

CROSS-REFERENCE TO RELATED APPLICATION

This application is based on and claims priority to U.S. Provisional Patent Application No. 61/523,297 filed on Aug. 13, 2011, which is incorporated herein by reference in its entirety for all purposes.

FIELD OF THE INVENTION

The present invention relates generally to the field of retail displays. More particularly, the present invention relates to a retail display including an alarm and power source permanently attached to a protected device.

BACKGROUND

In the field of retail displays, there is a need to display small items, typically electronics such as cell-phones, camcorders, cameras, and computers in a way that allows consumers to manipulate the devices in the store. A security problem exists, however, because the devices are typically small and valuable, making them ideal targets for theft. One common solution to the aforementioned security problem is to anchor the device to a shelf, table, or display. Such displays typically include mechanical attachments or adhesive attachments to secure the protected device to the display surface. The displays often include a powered item attachment device that attaches to the protected device, and a base unit onto which the powered item attachment device rests when the protected device is not being held by a customer. Additionally, the displays are often configured to align the protected device in a particular orientation when the powered item attachment device is replaced on the base unit. Existing displays also may provide power to the protected device and/or alarm capabilities in the event the device is removed from the display.

The existing displays lack the ability, however, to identify to store personnel which protected device has been removed from the display, and who removed it.

SUMMARY

The present invention relates to a powered item attachment device which is permanently attached to a protected item. The powered item attachment device can include a housing, at least one printed circuit board, a sound generation element, an onboard power supply, and an alarm which activates the sound generation element. The alarm circuit can also be powered by the onboard power supply and can be activated if the protected device is tampered with.

It will be understood by those skilled in the art that one or more aspects of this invention can meet certain objectives, while one or more other aspects can lead to certain other objectives. Other objects, features, benefits and advantages of the present invention will be apparent in this summary and descriptions of the disclosed embodiment, and will be readily apparent to those skilled in the art. Such objects, features, benefits and advantages will be apparent from the above as taken in conjunction with the accompanying figures and all reasonable inferences to be drawn therefrom.

BRIEF DESCRIPTION OF THE DRAWINGS

FIG. 3 is an exploded perspective view of a powered item attachment device in accordance with one embodiment of the invention;

FIG. 4 is another exploded perspective view of the powered item attachment device of FIG. 3; and FIG. 5 is another perspective view of one powered item attachment device and one base unit of the retail security display system of FIG. 1.

DETAILED DESCRIPTION

Figure 1:
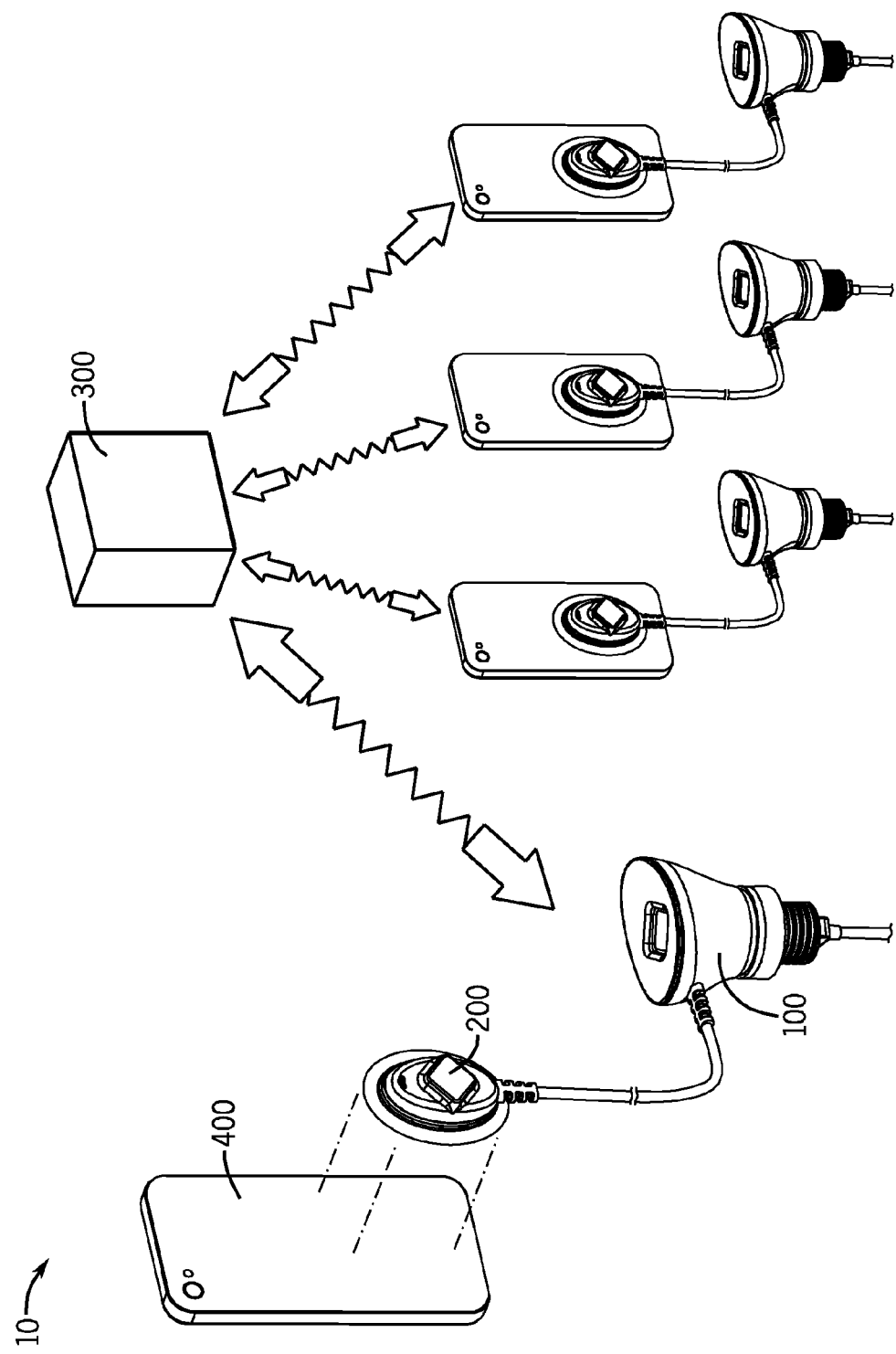
FIG. 1 is a schematic view of one embodiment of a retail security display system in accordance with one embodiment the invention.
Figure 2:
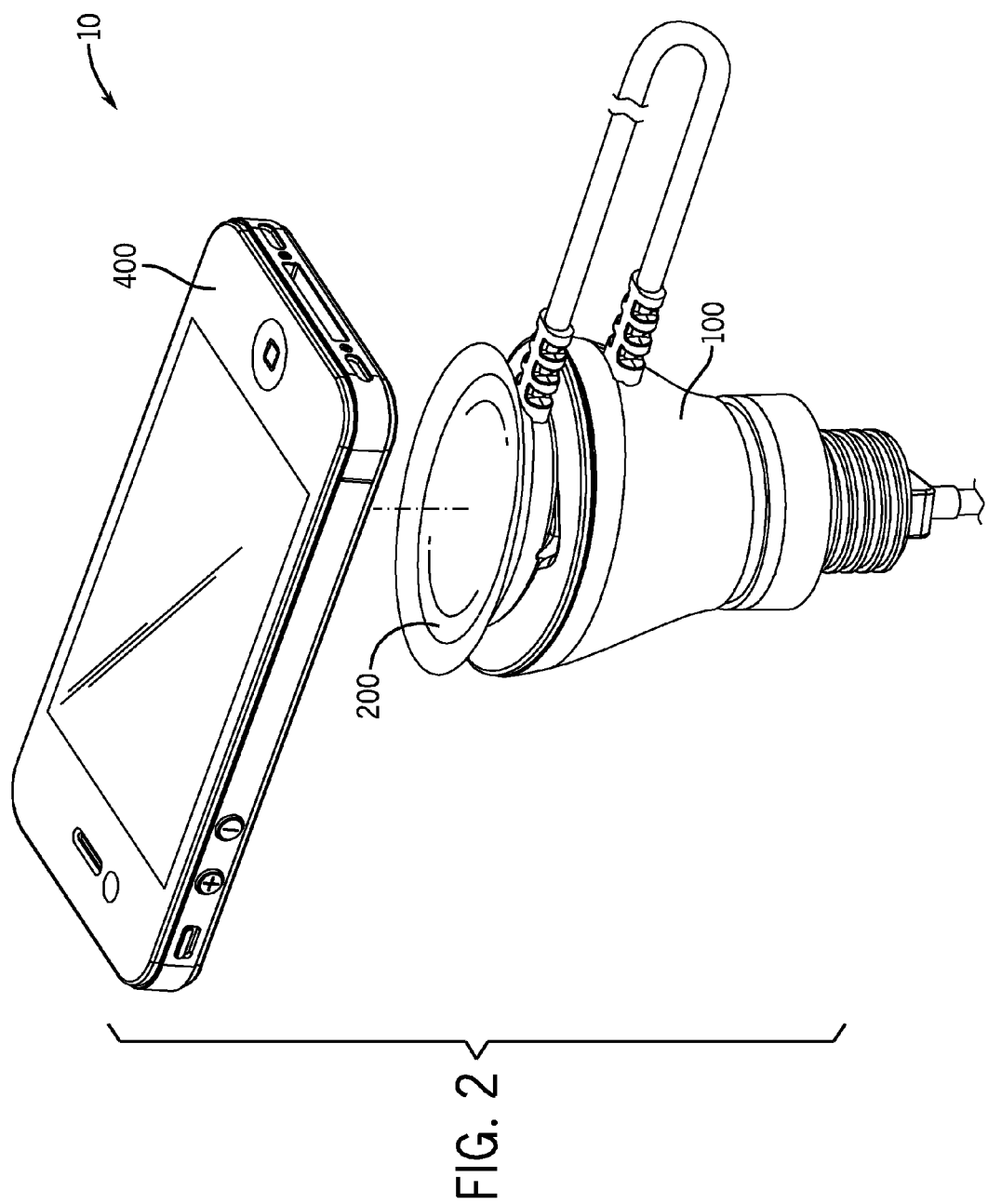
FIG. 2 is a perspective view of a powered item attachment device and one base unit of the retail security display system of FIG. 1.

Referring to FIGS. 1-2, one embodiment of a powered item attachment device 200 is shown. In the embodiment shown, the powered item attachment device 200 is part of a retail security display 10. The retail security display 10 includes a base unit 100, a powered item attachment device 200, and a central communication module 300. The powered item attachment device 200 is attached by permanent adhesive to a protected device 400. The base unit 100 is electrically connected to a DC power supply. The base unit 100 is semi-permanently attached to a display surface (not shown) and is also electrically connected to powered item attachment device 200. In the embodiment shown, the base unit 100 communicates with the central communication module 300.

Turning now to FIGS. 3-4, exploded views of the powered item attachment device 200 are shown. In the embodiment shown, the powered item attachment device 200 includes a housing 202, a cable 204, a printed circuit board ("PCB") 206, a battery 208, a plurality of magnets 210, a magnet retention clip 212, a sonic transducer 214, and a skirt 216. The cable 204 connects the powered item attachment device 200 to the base unit 100.

In the embodiment shown, the housing 202 includes a magnet cavity 218 into which the plurality of magnets 210 is installed. In the embodiment shown, the magnet cavity 218 also forms a geometric alignment protrusion 217 that extends from the powered item attachment device 200. The plurality of magnets 210 are retained in the magnet cavity by the magnet retention clip 212. In the embodiment shown, the magnet retention clip 212 is heat staked to the housing 202. The magnet retention clip 212 may alternatively be attached to the housing 202 by ultrasonic welding, adhesive, or any other attachment means without departing from the invention. In addition to retaining the magnets 210 in the housing, the magnet retention clip 212 also includes a curved protrusion 220 that has a complementary shape to a specific curved inner portion 222 of the housing 202. The combination of the curved protrusion 220 and the curved inner portion 222 forms a resonance cavity 224 for the sonic transducer 214. The sonic transducer 214 is electrically connected to the first PCB 206, and provides operational and alarm tones. Other sound generating apparatuses may be used in place of the sonic transducer 214 without departing from the invention.

The first PCB 206 also includes a plurality of LEDs 226. The LEDs 226 illuminate to draw attention to the protected device 400, and may also be used to signal an alarm to store personnel. For example, if a thief attempts to steal the protected device 400, the LEDs 226 may flash, change colors, or otherwise draw attention to the powered item attachment device 200 and the thief. In the embodiment shown, the LEDs 226 display a plurality of colors, but single color LEDs or any other suitable light source may be used without departing from the invention. For example, the LEDs 226 may flash red when an alarm is triggered, but display blue when the alarm is simply armed. Alternatively, the LEDs 226 may display a pattern of colors to draw a customer's attention to the protected device 400.

The first PCB 206 further includes communications circuitry that allows the powered item attachment device to communicate to the base unit 100, which in turn communicates to the central communication module 300.

The skirt 216 encloses the housing 202. In the embodiment shown, the skirt 216 permits light from the LEDs 226 to emit the powered item attachment device 200. The skirt 216 includes an outer flange 228 that is resilient to allow the powered item attachment device to securely attach to a variety of protected devices 400. The inner portion of the skirt 230 has a metalized interior surface 231. High bond adhesive is applied to the exterior surface 232 of the inner portion of the skirt 230 so that when the powered item attachment device 200 is attached to the protected device 400, the two pieces are permanently bonded together. The powered item attachment device 200 may alternatively be adhered to the protected device 400 by any suitable means including but not limited to double sided tape or mechanical fasteners.

The head unit 200 further includes a sensor that will sound the alarm in the event the thief removes the protected device 400 from the head unit 200. Such a sensor may be mechanical, such as that described in U.S. Pat. No. 7,710,266. Alternatively, an optical sensor or proximity sensor may be used without departing from the invention.

The battery 208 included in the powered item attachment device 200 provides power to the powered item attachment device in the event that it is disconnected from the base unit 100. Such a loss of continuity between the powered item attachment device 200 and the base unit 100 will trigger the powered item attachment device alarm. The battery 208 is continuously charged by the wired connection to the base unit 100. The alarm will continue to sound as long as the battery 208 has power. Other self sustaining power sources may also be used in place of the battery 208 without departing from the invention. The inclusion of the battery 208 and alarm in the powered item attachment device 200 allows the alarm sound and illuminated LEDs 226 to travel with the protected device 400 in the event someone tampers with or disconnects the powered item attachment device and attempts to take the protected device 400 out of the store, thereby making it easier to track the protected device.

In the embodiment shown, when the alarm is activated, the central communication module 300 activates a mobile device manager application ("MDM") present on the protected device 400. MDM's are known in the art. In the embodiment shown, the central communication module 300 utilizes the MDM to lock the protected device 400, display to the thief that he has stolen the protected device, and further prevents the protected device from being powered off so that a Global Positioning System ("GPS") circuit onboard may be used to track the location of the protected device. Of course, the central communication module 300 may use the MDM to perform any number of additional functions without departing from the invention. When the MDM is activated, the central communication module 300 uses internet based security software to display to store personnel which protected device 400 has been tampered with and will use GPS data from the protected device to locate it within the store. If the thief manages to take the protected device 400 out of the store, the internet based security software will display GPS mapping software that will track the device.

Alternatively, the PCB 206 may include Near Field Communications circuitry ("NFC") (not shown) which, if the protected device 400 is so equipped, communicates with the protected device 400 to sound the protected device's internal alarm and trigger the devices onboard security sequence protocol in the event of a loss of continuity between the head unit 200 and the base unit 100. Additionally, once the internal alarm on the protected device 400 is activated, a internet based security software will display which protected device 400 has been tampered with and, if available, will use GPS data from the protected device to locate it within the store. If the thief manages to take the protected device 400 out of the store, the internet based security software will display GPS mapping software that will track the device. Of course, the retail security display system 10 may communicate with the protected device 400 by other communication means, be they wired or wireless. Additionally, the powered item attachment device 200 may include a GPS chipset (not shown) in the event the protected device 400 does not have one.

Turning now to FIG. 5, a base unit 100 in accordance with the invention is shown. The base unit 100 is semi-permanently attached to a display surface, and includes a DC power supply that plugs into a typical wall socket. The power provided to the base unit 100 powers both the base unit and the powered item attachment device 200.

The base unit 100 supports and orients the powered item attachment device 200. In the embodiment shown, the base unit 100 includes a top cover 102 that supports, centers, and orients the powered item attachment device 200. The top cover 102 includes a geometric alignment cavity 104, which interacts with the geometrical alignment protrusion 217 of the powered item attachment device 200. Additionally, a plurality of magnets are attached to the top cover 102 such that when the powered item attachment device 200 is aligned to the base unit 100, the magnets secure the base unit and powered item attachment device to each other.

In other embodiments, the powered item attachment device 200 may communicate wirelessly to the base unit 100 or central communication module. In such an embodiment, the powered item attachment device 200 would not be physically tethered to the base unit 100 or the display surface. The base unit 100 and powered item attachment device 200 may include charging pins that electrically connect the base unit to the powered item attachment device when the powered item attachment device is attached to the base unit. Including charging pins to electrically connect the base unit 100 and the powered item attachment device 200 allows the battery 210 in the powered item attachment device to maintain a full charge, and allows the powered item attachment device 10 to power the protected device 400 while it is sitting on the base unit. Because the powered item attachment device 200 is not electrically connected to the base unit 100, the communications circuitry communicates wirelessly to the base unit 100 and/or central communication module 300. When the powered item attachment device 200 is removed from the base unit 100, the protected device 400 would use its onboard battery to power itself, and the battery 210 would be used only to power the LEDs 226 and a proximity alarm system. A proximity alarm system is used in this embodiment because the continuity between the base unit 100 and the powered item attachment device 200 is broken every time the protected device 400 is picked up from the base unit, so an alarm triggered by such a break in continuity would not work. The proximity alarm works by incorporating at least one proximity sensor in the base unit 100 and/or powered item attachment device 200 that senses when the powered item attachment device is too remote from the base unit, thereby triggering the alarm. Of course, any proximity sensor could be used without departing from the invention.

Although the invention has been herein described in what is perceived to be the most practical and preferred embodiments, it is to be understood that the invention is not intended to be limited to the specific embodiments set forth above. Rather, it is recognized that modifications may be made by one of skill in the art of the invention without departing from the spirit or intent of the invention and, therefore, the invention is to be taken as including all reasonable equivalents to the subject matter of the appended claims and the description of the invention herein.

What is claimed is:

1. A powered item attachment device permanently attached to a protected device comprising:
    a housing;
    a skirt enclosing the housing,
    a plurality of LEDs mounted within the housing and within the skirt and that emit light through the skirt,
    at least one printed circuit board within the housing;
    a sound generation element within the housing;
    an onboard power supply within the housing;
    an alarm which activates the sound generation elements, the alarm circuit activated if the protected device is tampered with; the alarm causing a change in state of the LEDs to draw attention to the powered item attachment, and
    wherein the alarm on the powered item attachment device is powered by the onboard power supply.

2. The powered item attachment device of claim 1 wherein the powered item attachment device includes a magnet cavity in the housing into which at least one magnet is secured.

3. The display system of claim 1 wherein the includes a resilient outer flange.

4. The powered item attachment device of claim 1 wherein the LEDs change state by flashing.

5. The powered item attachment device of claim 1 wherein the LEDs change state by changing color.

6. The powered item attachment device of claim 1 wherein the powered item attachment device includes a Global Positioning System chipset that allows the location of the powered item attachment device to be tracked using the GPS data provided by the GPS chipset.

7. The powered item attachment device of claim 1 wherein the powered item attachment device further includes a proximity sensor.

* * * * *

UNITED STATES PATENT AND TRADEMARK OFFICE
CERTIFICATE OF CORRECTION

PATENT NO. : 8,872,660 B2  
APPLICATION NO. : 13/584229  
DATED : October 28, 2014  
INVENTOR(S) : Yunker et al.

It is certified that error appears in the above-identified patent and that said Letters Patent is hereby corrected as shown below:

Title Page

Item (73) Assignee: add -- Tracthat LLC, Milwaukee, WI (US) --.

In the Claims

Column 6, claim 3  
Line 9, the word --skirt-- should precede the word "includes".

Signed and Sealed this  
Eighth Day of September, 2015

Michelle K. Lee  
*Director of the United States Patent and Trademark Office*